(12) United States Patent
Eckberg et al.

(10) Patent No.: US 8,840,034 B2
(45) Date of Patent: Sep. 23, 2014

(54) AUTOMATIC IN SITU COOLANT FLOW CONTROL IN LFT HEAT EXCHANGER

(75) Inventors: Eric Alan Eckberg, Rochester, MN (US); Eric Vance Kline, Rochester, MN (US); Paul N. Krystek, Highland, NY (US); Michael Robert Rasmussen, Mazeppa, MN (US); Stephen M. Zins, Oronoco, MN (US)

(73) Assignee: International Business Machines Corporation, Armonk, NY (US)

( * ) Notice: Subject to any disclaimer, the term of this patent is extended or adjusted under 35 U.S.C. 154(b) by 659 days.

(21) Appl. No.: 13/157,522

(22) Filed: Jun. 10, 2011

(65) Prior Publication Data

US 2012/0312510 A1    Dec. 13, 2012

(51) Int. Cl.
*G05D 23/02* (2006.01)
(52) U.S. Cl.
USPC ............... 236/101 R; 236/101 A; 236/103
(58) Field of Classification Search
CPC ... G05D 23/02; G05D 23/08; G05D 23/1852; G05D 23/1854; G05D 23/2754; G05D 23/27541
USPC .......... 236/101 R, 101 A, 101 D, 101 E, 103, 236/92 R; 165/104.19, 104.33
See application file for complete search history.

(56) References Cited

U.S. PATENT DOCUMENTS

| | | | |
|---|---|---|---|
| 5,132,873 A | 7/1992 | Nelson et al. | |
| 5,186,385 A * | 2/1993 | Karabin et al. | 236/1 G |
| 5,967,409 A | 10/1999 | Benedict | |
| 6,039,262 A | 3/2000 | DeAnna | |
| 6,182,749 B1 | 2/2001 | Brost et al. | |
| 6,330,157 B1 | 12/2001 | Bezama et al. | |
| 7,559,485 B2 * | 7/2009 | Monson et al. | 236/93 R |
| 8,434,692 B2 * | 5/2013 | Scott et al. | 236/93 R |
| 8,556,186 B2 * | 10/2013 | Sand | 236/34 |
| 2001/0037880 A1 | 11/2001 | Solondz | |
| 2006/0262503 A1 | 11/2006 | Bevan et al. | |
| 2009/0200007 A1 | 8/2009 | Foy et al. | |

OTHER PUBLICATIONS

Eckberg et al., "Automatic in Situ Coolant Flow Control in LFT Heat Exchanger," U.S. Appl. No. 14/327,717, filed Jul. 10, 2014, 18 pages.

* cited by examiner

*Primary Examiner* — Marc Norman
(74) *Attorney, Agent, or Firm* — Yee & Associates, P.C.; Parashos Kalaitzis

(57) ABSTRACT

An embodiment of the invention is directed to coolant flow control apparatus, in association with a liquid flow through heat exchanger situated to cool one or more electronic or other device. The apparatus comprises a first input channel for carrying liquid coolant to a first input of the heat exchanger, and further comprises a flow control device positioned along a flow path that includes the first input channel. The flow control device is provided with a gating element supported for selected movement across the flow path, in order to selectively vary the amount of coolant moving through the flow path. The apparatus further include an actuator located in the flow control device that comprises a metal component which is directly tied to the gating element, wherein the metal component changes its shape in response to specified changes in coolant temperature, and a given change in the shape of the metal component acts to selectively move the gating element with respect to the flow path.

9 Claims, 4 Drawing Sheets

US 8,840,034 B2

AUTOMATIC IN SITU COOLANT FLOW CONTROL IN LFT HEAT EXCHANGER

BACKGROUND OF THE INVENTION

1. Field of the Invention

The invention disclosed and claimed herein generally pertains to an apparatus and method for controlling the flow of liquid coolant to a liquid flow through (LFT) heat exchanger, such as a heat exchanger used to provide cooling for one or more electronic devices. More particularly, the invention pertains to an apparatus and method of the above type, wherein a component located proximate to a heat exchanger regulates coolant flow automatically, in response to changes in coolant temperature.

2. Description of the Related Art

High performance computing systems are using ever-increasing amounts of power, at higher power densities. As a result, it has become common to meet system cooling requirements by means of LFT heat sink and heat exchange technologies. Also, semiconductor electronic devices that have very different cooling requirements from each other, because of different size or duty cycle, may be located on the same PCB assembly, or may otherwise be adjacent to each other. This situation presents a further challenge.

Conventional heat sink and heat exchange technologies have generally carried out their tasks in the static domain. That is, a heat exchanger typically cannot actively control or adjust its own cooling profile. If such active control were to be achieved, it could permit the operational function of maintaining the multiple devices which were adjacent to one another at the same temperature. Alternatively, such active control capability could permit the temperatures of different device types, such as processors, memories and voltage regulator modules, to be selectively offset from one another.

SUMMARY OF THE INVENTION

In embodiments of the invention, a system for providing coolant to a number of heat exchangers, each adjacent to one or more different electronic devices, includes the same number of valves. Each valve is located proximate to one of the heat exchangers, and automatically controls the flow of coolant thereto based on the temperature local to that valve. Each of the valves comprises a device such as a bi-metallic actuator, or a shape memory alloy (SMA) which has a metallic component that changes shape in response to temperature. One embodiment of the invention is directed to coolant flow control apparatus, in association with an LFT heat exchanger situated to remove heat from one or more electronic devices. The apparatus comprises a first input channel for carrying liquid coolant to a first input of the heat exchanger, and further comprises a flow control device positioned along a flow path that includes the first input channel. The flow control device is provided with a gating element supported for selected movements across the flow path, in order to selectively vary the amount of coolant moving through the flow path. The apparatus further includes an actuator located in the flow control device that comprises a metal component which is directly tied to the gating element. The metal component changes its shape in response to specified changes in coolant temperature, and a given change in the shape of the metal component acts to selectively move or displace the gating element with respect to the flow path.

DETAILED DESCRIPTION

Figure 1:
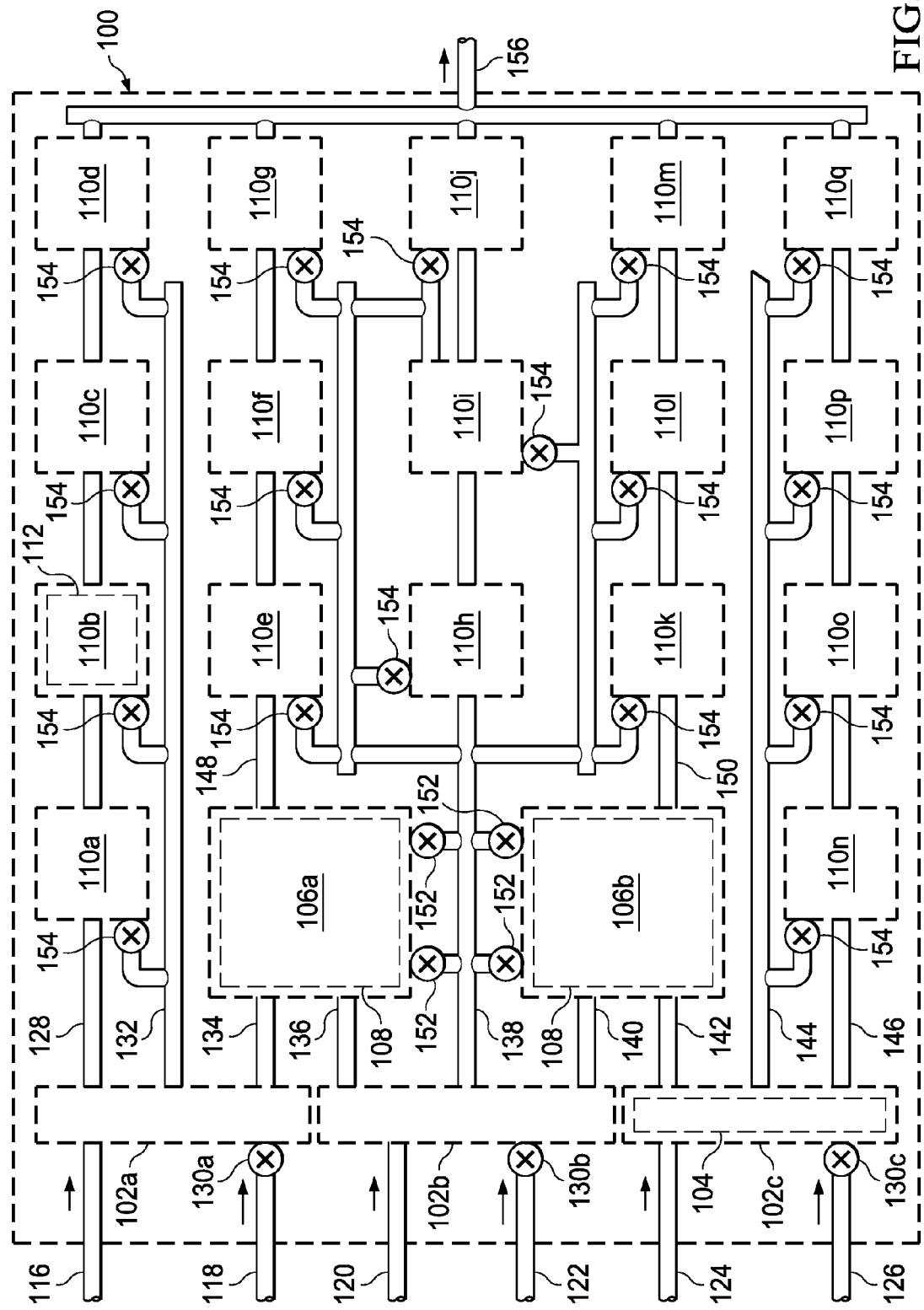
FIG. 1 is a block diagram illustrating an embodiment of the invention.

Referring to FIG. 1, there is shown a configuration of LFT heat exchangers 102a-c, 106a-b, and 110a-q that are grouped together. Each of the heat exchangers is placed upon a corresponding electronic device, to selectively remove heat therefrom. For example, each of the heat exchangers 102a-c is positioned to provide cooling or heat removal for a voltage regulator module (VRM) 104, as shown in connection with heat exchanger 102c. Heat exchangers 106a-b are each similarly positioned to provide cooling or heat removal for a processor 108, as shown in connection with heat exchangers 106a and b. Heat exchangers 110a-q are each positioned to provide cooling for a dynamic random access memory (DRAM) 112, as shown in connection with heat exchanger 110b. These electronic devices are respectively mounted upon a common platform or carrier, such as a PCB 100.

It is to be emphasized in regard to embodiments of the invention that one or more of the heat exchangers shown in FIG. 1 could, if desired, provide heat removal for multiple corresponding devices, and are thus not limited to cooling only a single device. For example, heat exchanger 110a could be mounted upon the two DRAMS 112, rather than a single DRAM, and provide cooling for both DRAMS.

Referring further to FIG. 1, it is shown that each of the LFT heat exchangers has at least two input channels or lines, for receiving a coolant fluid such as water, and also has one or more output channels. For example, heat exchanger 102a has input channels 116 and 118 and output channels 128-134; heat exchanger 102b has input channels 120 and 122, and output channels 136-140; and heat exchanger 102c has input channels 124 and 126, and output channels 142-146.

Moreover, as an essential feature of embodiments of the invention, a temperature responsive flow control device is placed in one of the coolant input channels of each of the heat exchangers shown in FIG. 1. Thus, flow control devices 130a-c are positioned to control or modulate coolant flow through each of the channels 118, 122, and 126, to inputs of heat exchangers 102a-c, respectively. Each of the flow control devices comprises a thermally actuated valve.

In a configuration of electronic devices as disclosed by FIG. 1, different types of devices can dissipate very different amounts of thermal power. Also, different devices of the same type can dissipate different amounts of thermal power, such as when they have different duty cycles, and a particular device can dissipate different amounts of thermal power at different times. Accordingly, in embodiments of the invention thermally actuated valves as referred to above are distributed among a network of coolant flow paths of a heat exchanger arrangement, so that each valve is proximate or local to a heat exchanger which is provided for one of a plurality of electronic devices. The valve for a particular heat exchanger is responsive to changes in coolant temperature at its heat exchanger, to selectively increase or decrease the flow of coolant thereto.

As a further important feature of embodiments of the invention, each of the coolant flow devices, or thermally actuated valves, comprises a mechanism having a metal component that changes or shifts its shape, in response to an adjacent change in temperature or thermal energy. One type of such mechanism uses a bimetallic member, as described hereinafter in connection with FIG. 3. Another type, such as a shape memory alloy (SMA), employs a memory metal. By using a device of such type for the thermally actuated valves, each valve will operate automatically, in response only to local temperature change, to vary the coolant flow to its heat exchanger. Each such valve or coolant flow device thus needs no other direction or regulation.

By incorporating the above capabilities, embodiments of the invention provide a cooling system which dynamically configures system components to adjust or vary coolant flow, such as to direct more coolant flow to regions where electronic devices are running hotter and producing more thermal energy. These system embodiments operate automatically, and have no need of any external logic to manage their cooling performance or function.

As a useful feature for certain embodiments of the invention, each of the heat exchangers of FIG. 1 also receives coolant from a coolant input channel that is not regulated or modulated by a flow control device or valve, of the type described above. For example, FIG. 1 shows heat changers 102a-c receiving coolant from unmodulated input channels 116, 120, and 124, respectively. Since different types of electronic devices can have very different cooling requirements, the unmodulated input channels can be used to provide different amounts of static cooling to the different devices. Also, use of the unmodulated coolant input channels provides a measure of safety, such as to prevent overheating in the event that one of the thermally actuated valves malfunctions. In some embodiments of the invention, the unmodulated coolant input channels would not be needed.

Referring further to FIG. 1, there is shown heat exchangers 110a-d receiving coolant from unmodulated channel 128, and also receiving coolant from channel 132 through respective flow control devices 154. Heat exchangers 110n-q receive coolant from unmodulated channel 146, and also receive coolant from channel 144 through respective flow control devices 154.

Heat exchanger 106a receives coolant from two unmodulated channels 134 and 136, and has an output channel 148. Heat exchanger 106b likewise receives coolant from two unmodulated channels 140 and 142, and has an output channel 150. Both heat exchangers 106a and 106b receive coolant from input channel 138 through two flow control devices 152.

FIG. 1 further shows heat exchangers 110e-g receiving coolant from unmodulated channel 148. Heat exchangers 110h-j receive coolant from unmodulated channel 138, and heat exchangers 110k-m receive coolant from unmodulated channel 150. Heat exchangers 110e-m also receive coolant from channel 138, through respective flow control devices 154.

FIG. 1 additionally shows an output channel 156, which is positioned to carry coolant away from respective heat exchangers of FIG. 1.

Figure 2:
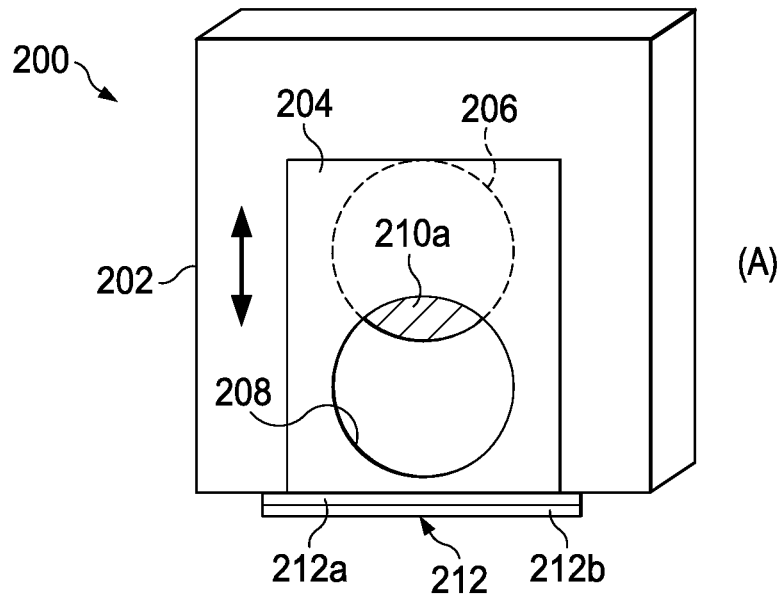
FIG. 2 is a schematic diagram depicting a thermally actuated valve for the embodiment of FIG. 1 that uses a bimetallic actuator.
Figure 2:
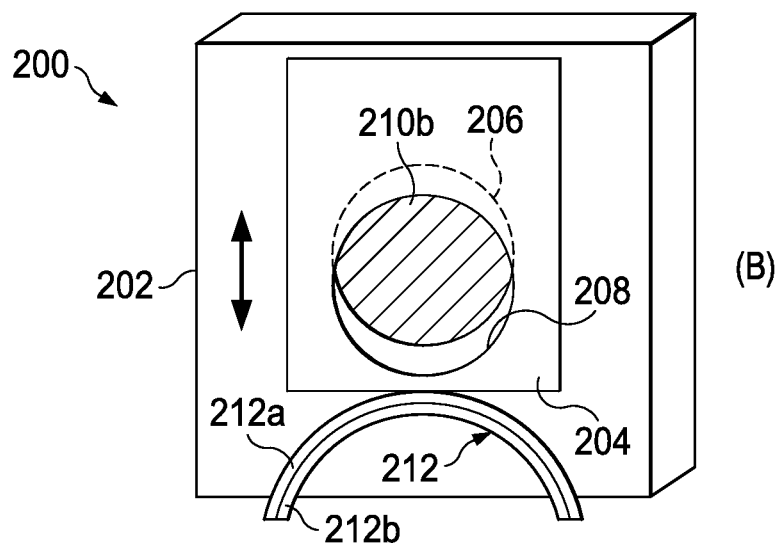

Referring to FIG. 2, there is shown a thermally actuated valve 200 which may usefully be employed in embodiments of the invention as a coolant flow device that is responsive to temperature changes, such as devices 130a-c described above. FIG. 2 shows flow device 200 in two different modes of operation, referenced as modes (A) and (B). Each mode shows device 200 provided with a housing or case 202, and with a gate 204. Gate 204 is mounted for linear movement with respect to housing 202, or for upward and downward movement as viewed in FIG. 2.

Coolant flow device 200 is usefully placed within the coolant fluid chamber of a heat exchanger, such as heat exchanger 102a of FIG. 1 by way of example, and is immersed in the coolant fluid contained in the heat exchanger. Flow device 200 is thus able to readily respond to changes in coolant temperature, such as when the heat exchanger receives increased thermal energy from its associated electronic device. Flow device 200 is also positioned to selectively close or seal an input port 206 of the heat exchanger, wherein port 206 passes coolant into the heat exchanger from an input channel, e.g. channel 118 of FIG. 1.

Referring further to FIG. 2, there is shown a circular aperture 208 formed through gate 204. When aperture 208 is at least partially aligned with port 206, coolant can flow into the heat exchanger through the port 206. Thus, the amount of coolant flow allowed by device 200 can be varied, by moving gate 204 upward or downward as viewed in FIG. 2. In mode (A) of FIG. 2, a portion 210a of aperture 208 is aligned with port 206. This alignment enables an amount of coolant to flow into the heat exchanger which is 15% of the maximum amount which would flow if the entire area of aperture 208 was aligned with port 206. Mode (B) of FIG. 2 shows a portion 210b of aperture 208 aligned with port 206, wherein this alignment enables 85% of the maximum coolant amount to flow into the heat exchanger. It is to be emphasized that both the 15% and 85% amounts are given by way of example only, and do not in any way limit the scope of the invention.

In order to linearly move gate 204 and aperture 208 automatically, and in response to local coolant temperature change within the heat exchanger, a bimetallic strip 212 is joined to gate 204. A bimetallic strip generally is used to convert a temperature change into mechanical displacement, and comprises two strips of metal that have different coefficients of thermal expansion (CTE). Thus, bimetallic strip 212 comprises strips 212a and 212b, wherein by way of example one of the strips could be formed of steel and the other of copper or brass. Strips 212a and 212b are rigidly bonded to each other along their respective lengths.

Mode (A) of FIG. 2 shows strips 212a and 212b in a relaxed condition, at some temperature. In Mode (B), the temperature of coolant adjacent to device 200 has increased. This causes strips 212a and 212b to both expand. However, because of the difference in CTE of the two strips, the combined structure 212 is caused to bend. This, in turn, moves gate 204 and aperture 208 to increase the flow of coolant into the heat exchanger, through port 206.

It is anticipated that a wide range of design choices is available, in embodiments of the invention that employ flow control device 200 of FIG. 2. For example, gate 204 could be moved to control coolant flow over a range of 0% to 100% of the possible maximum amount. Alternatively, the range could be designed to lie between 15% and 85% of the maximum, as depicted by Modes (A) and (B), respectively, of FIG. 2. Flow control device 200 could also be designed for binomial, linear or non-linear operation, to implement a selected functional relationship between temperature and coolant flow.

In other embodiments of the invention, a shape memory alloy (SMA) could be used instead of the bimetallic strip of FIG. 2. An SMA is an alloy that remembers its original cold forged shape, and returns to its predeformed shape when heated.

Figure 3:
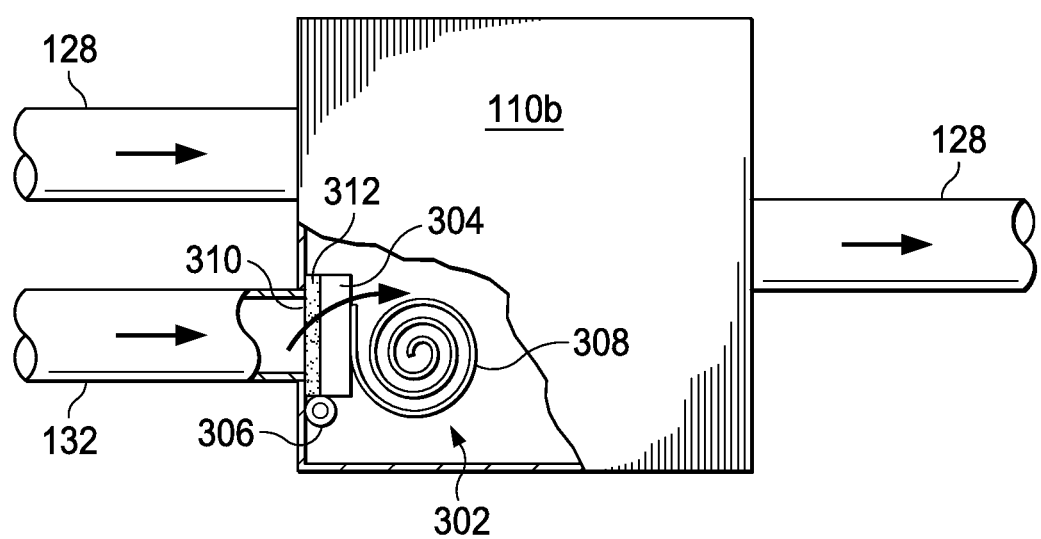
FIG. 3 is a schematic diagram showing a heat exchanger for the embodiment of FIG. 1 in greater detail.

Referring to FIG. 3, there is shown one of the heat exchangers of the embodiment of FIG. 1. More particularly, FIG. 3 depicts an overhead view of heat exchanger 110b, with a section broken away to illustrate a flow control device 302 located within heat exchanger 110b. Device 302 includes a gate 304, which is pivotable about a hinge 306 to selectively close or seal a port 310, and thus prevent coolant flow into heat exchanger 110b from input channel 132. Gate 304 may be pivoted further to enable pre-determined amounts of coolant to flow into heat exchanger 110b from channel 132.

FIG. 3 further shows gate 304 moved by an actuating mechanism 308 that comprises a bimetallic coil. Coil 308 is contained within the coolant chamber of heat exchanger 110b, and is designed to respond to rising temperature therein by moving gate 304 to open port 310, to enable or increase coolant flow into heat exchanger 110b from channel 132. Coil 308 responds to falling temperatures by moving gate 304 to prevent or reduce the flow of coolant from input channel 132. Bimetallic coil 308 comprises a strip formed of two metal strips with different CTEs, as described above, which is wound into the form of a spiral or the like. Usefully, gate 304 is covered with a layer of insulating material 312, to provide a thermal barrier between coolant in the chamber of heat exchanger 110b, and the coolant in input channel 132.

The rate of opening or closing the flow control device 302 could be a design variable. The flow control could be configured to open around a particular temperature, or could begin to open upon reaching a specified narrow temperature range. By judicious selection of the materials for the bimetallic strips as well as their respective CTEs, their thicknesses and three dimensional shapes, flow control device 302 may be selectively tuned, in order to provide a minimum temperature at which the input coolant port begins to open, and the rate at which it opens.

Multiple flow control devices may also be constructed in accordance with embodiments of the inventions, for use with different heat exchangers that are adjacent to one another. Different flow controls may be tuned so that they are offset from each other, that is, they respond to different respective temperatures. The flow control devices could also be designed for binomial, linear and non-linear operation.

Figure 4:
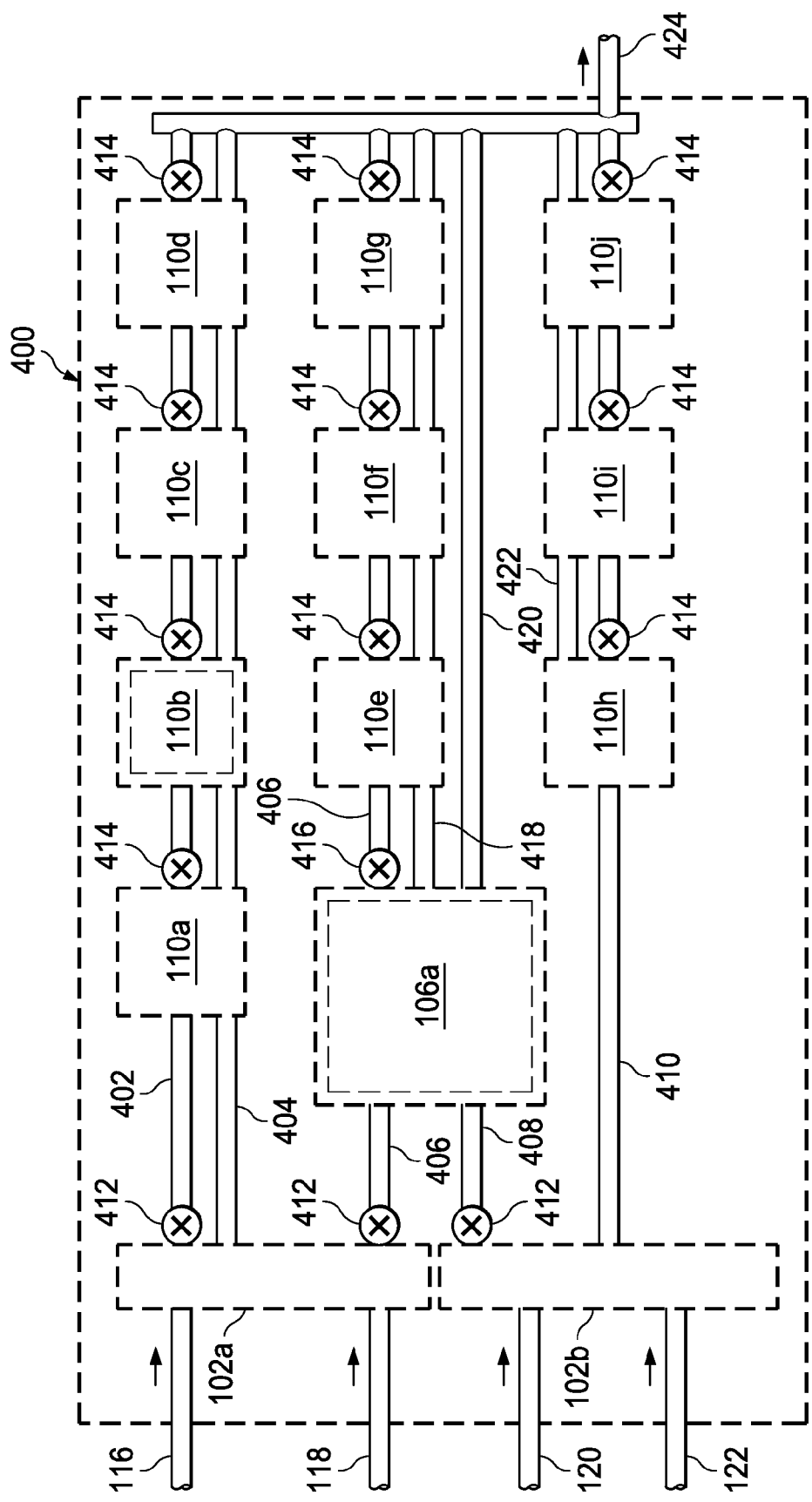
FIG. 4 is a block diagram illustrating a further embodiment of the invention.

Referring to FIG. 4, there are shown a number of the LFT heat exchangers of FIG. 1, respectively mounted on a PCB 400 or the like, to illustrate a further embodiment of the invention. FIG. 4 thus includes heat exchangers 102a-b, 106a and 110a-j, which each provides cooling for a corresponding electronic device as described above. Each of the heat exchangers shown in FIG. 4 has at least two coolant output channels, and one or more coolant input channels. Accordingly, heat exchanger 102a has input channels 116 and 118, and output channels 402, 404 and 406. Segments of channels 402 and 404 respectively serve as input and output channels for heat exchangers 110a-d.

Similarly, heat exchanger 102b has input channels 120 and 122, and output channels 408 and 410. Segments of channel 410 respectively serve as input and output channels for heat exchangers 110h-j. Channels 406 and 408 are coolant input channels for heat exchanger 106a, and a segment of channel 406 comprises an output channel therefor. Segments of channel 406 respectively serve as input and output channels for heat exchangers 110e-g.

Referring further to FIG. 4, it is seen that a coolant flow control device of the type describe above is placed in one of the coolant channel outputs of each heat exchanger. Thus, flow control devices 412 are positioned to control coolant flow out from heat exchangers 102a and 102b, through channels 402, 406 and 408. In this configuration, respective flow control devices may limit or regulate coolant flow to downstream heat exchangers. For example, the flow control device 412 in channel 402 can impact coolant flow to each of the heat exchangers 110a-d. Moreover, each of the heat exchangers 110a-j has a flow control device 414 at one of its output channels, and thus can likewise impact downstream heat exchangers.

FIG. 4 further shows heat exchanger 106a having a coolant flow device 416 in its output channel 406. Also, each of the heat exchangers has at least one output coolant channel that is unmodulated or not controlled. Thus, heat exchangers 102a-b have unmodulated output channels 404 and 410, respectively, and heat exchanger 106a has unmodulated output channels 418 and 420. Heat exchangers 110a-d, 110e-g and 110h-j have unmodulated output channels 404, 418 and 422 respectively.

FIG. 4 further shows the embodiment thereof provided with a coolant output channel 424.

In embodiments of the invention, modulated and unmodulated channels can be of different aperture sizes with respect to each other. Also, channels can be straight, serpentine or comprise a cavity within a heat exchanger.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. In association with a liquid flow through a heat exchanger situated to remove heat from one or more devices, a coolant flow control apparatus comprising:

a first input channel for carrying liquid coolant to a first input of the heat exchanger;

a flow control device positioned along a flow path that includes the first input channel, wherein the flow control device is provided with a gating element supported for selected movements across the flow path, in order to selectively vary an amount of coolant moving through the flow path;

an actuator located in the flow control device that comprises a metal component which is directly tied to the gating element, wherein the metal component changes its shape in response to specified changes in coolant temperature, and a given change in the shape of the metal component acts to selectively displace the gating element with respect to the flow path, and wherein the metal component, in response to a temperature of coolant proximate to the flow control device, is operable to move the gating element to enable or prevent, selectively, coolant flow along the first input channel into the heat exchanger;

a second input channel is provided for carrying liquid coolant to a second input of the heat exchanger, during times when the gating element of the flow control device is both enabling and preventing said coolant flow along the first input channel into the heat exchanger; and at least one output channel is provided for carrying coolant away from the heat exchanger.

2. The coolant flow control apparatus of claim 1, wherein:
said flow path includes a chamber within the heat exchanger that contains coolant, and wherein the metal component is located in the chamber, and selectively changes its shape in response to temperature changes of the coolant in the chamber.

3. The coolant flow control apparatus of claim 2, wherein:
the gating element of the flow control device is positioned to selectively vary the amount of coolant flowing into the first input of the heat exchanger from the first input channel.

4. The coolant flow control apparatus of claim 3, wherein:
the gating element is provided with a layer of insulating material, to provide a thermal barrier between coolant in the chamber of the heat exchanger, and coolant in the first input channel.

5. The coolant flow control apparatus of claim 1, wherein:
the metal component comprises a bimetallic strip formed of selected metals.

6. The coolant flow control apparatus of claim 1, wherein:
the metal component comprises a shape memory alloy formed of selected metals.

7. The coolant flow control apparatus of claim 1, wherein:
the at least one output channel is provided for carrying coolant away from a given output of the heat exchanger, and wherein the gating element of the flow control device is positioned to selectively vary the amount of coolant flowing from the given output of the heat exchanger into the at least one output channel.

8. In association with a liquid flow through a heat exchanger situated to remove heat from one or more electronic devices, a method for coolant flow control comprising:
providing a first input channel for carrying liquid coolant to a first input of the heat exchanger;
positioning a flow control device along a flow path that includes the first input channel, wherein the flow control device is provided with a gating element supported for selected movement across the flow path, in order to selectively vary an amount of coolant moving through the flow path;
locating an actuator in the flow control device that comprises a metal component which is directly tied to the gating component, wherein the metal component changes its shape in response to specified changes in coolant temperature, and a given change in the shape of the metal component acts to selectively displace the gating element with respect to the flow path, and wherein the metal component, in response to a temperature of coolant proximate to the flow control device, is operable to move the gating element to enable or prevent, selectively, coolant flow along the first input channel into the heat exchanger;
providing a second input channel for carrying liquid coolant to a second input of the heat exchanger, during times when the gating element of the flow control device is both enabling and preventing said coolant flow along the first input channel into the heat exchanger; and
providing at least one output channel for carrying coolant away from the heat exchanger.

9. The method of claim 8, wherein:
said flow path includes a chamber within the heat exchanger that contains coolant, and wherein the metal component is located in the chamber, and selectively changes its shape in response to temperature changes of the coolant in the chamber.

\* \* \* \* \*